(12) United States Patent
Wang

(10) Patent No.: US 9,754,668 B1
(45) Date of Patent: Sep. 5, 2017

(54) DIGITAL PERCEPTRON

(71) Applicant: FlashSilicon Incorporation, Diamond Bar, CA (US)

(72) Inventor: Lee Wang, Diamond Bar, CA (US)

(73) Assignee: FLASHSILICON INCORPORATION, Diamond Bar, CA (US)

( * ) Notice: Subject to any disclaimer, the term of this patent is extended or adjusted under 35 U.S.C. 154(b) by 0 days.

(21) Appl. No.: 15/059,733

(22) Filed: Mar. 3, 2016

(51) Int. Cl.
| G11C 15/04 | (2006.01) |
| G11C 7/22 | (2006.01) |
| G11C 5/06 | (2006.01) |
| G06F 12/1027 | (2016.01) |
| G06F 12/10 | (2016.01) |
| G11C 15/00 | (2006.01) |
| G06F 12/1036 | (2016.01) |

(52) U.S. Cl.
CPC .......... *G11C 15/046* (2013.01); *G06F 12/10* (2013.01); *G06F 12/1027* (2013.01); *G06F 12/1036* (2013.01); *G11C 5/06* (2013.01); *G11C 7/22* (2013.01); *G11C 15/00* (2013.01); *G11C 15/04* (2013.01)

(58) Field of Classification Search
CPC ........ G11C 15/00; G11C 15/04; G11C 15/046
See application file for complete search history.

(56) References Cited

U.S. PATENT DOCUMENTS

| 5,299,147 | A | * | 3/1994 | Holst | G11C 11/413 365/189.04 |
| 5,396,448 | A | * | 3/1995 | Takayanagi | G11C 15/00 365/185.17 |
| 5,483,480 | A | * | 1/1996 | Yoneda | G11C 15/04 365/49.17 |
| 5,576,985 | A | * | 11/1996 | Holtz | G11C 15/046 365/105 |
| 5,893,929 | A | * | 4/1999 | Shadan | G11C 15/00 365/230.06 |
| 6,078,987 | A | * | 6/2000 | Kongetira | G11C 15/04 365/189.05 |
| 6,166,938 | A | * | 12/2000 | Wong | G11C 15/046 365/185.08 |
| 6,317,349 | B1 | * | 11/2001 | Wong | G11C 15/046 365/185.05 |
| 7,031,177 | B2 | * | 4/2006 | de Sandre | G11C 15/046 365/185.05 |
| 7,319,608 | B2 | * | 1/2008 | Hsu | G11C 15/046 365/104 |

(Continued)

*Primary Examiner* — Vanthu Nguyen
(74) *Attorney, Agent, or Firm* — Muncy, Geissler, Olds & Lowe, P.C.

(57) ABSTRACT

In view of the neural network information parallel processing, a digital perceptron device analogous to the build-in neural network hardware systems for parallel processing digital signals directly by the processor's memory content and memory perception in one feed-forward step is disclosed. The digital perceptron device of the invention applies the configurable content and perceptive non-volatile memory arrays as the memory processor hardware. The input digital signals are then broadcasted into the non-volatile content memory array for a match to output the digital signals from the perceptive non-volatile memory array as the content-perceptive digital perceptron device.

17 Claims, 11 Drawing Sheets

(56) References Cited

U.S. PATENT DOCUMENTS

| | | | |
|---|---|---|---|
| 8,559,232 B2 * | 10/2013 | Lee | G11C 16/0441 |
| | | | 365/185.25 |
| 8,817,546 B2 | 8/2014 | Wang | |
| 9,087,572 B2 * | 7/2015 | Sekar | G11C 15/00 |
| 2006/0285374 A1 * | 12/2006 | Szeto | G11C 15/046 |
| | | | 365/49.17 |

* cited by examiner

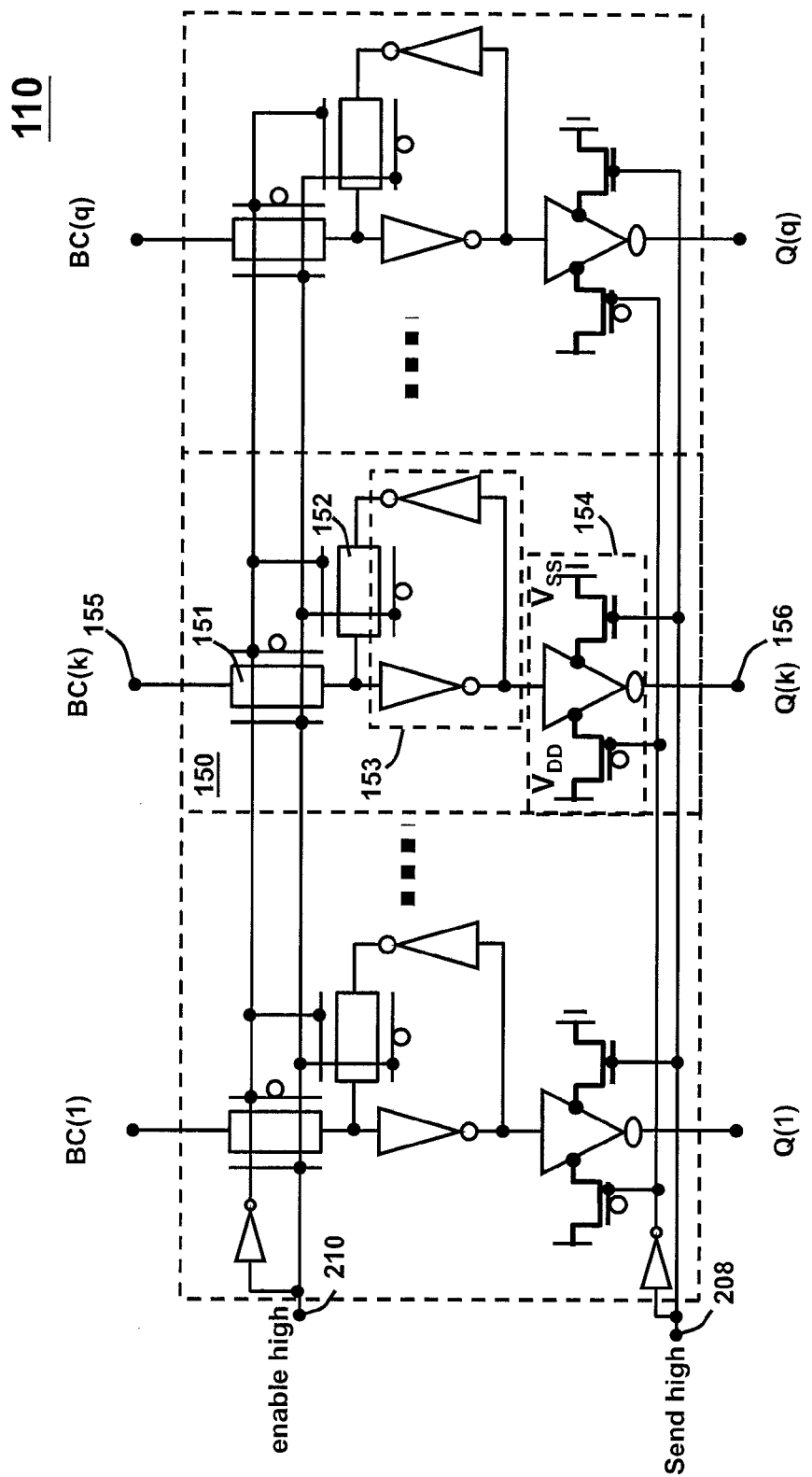

DIGITAL PERCEPTRON

BACKGROUND OF THE INVENTION

Field of the Invention

The invention is related to a digital signal processor, which can interpret the receptive digital signals into the perceptive output digital signals. In particular, the processor parallel processes digital information according to its pre-configured digital content and perceptive non-volatile memories without executing any sequential Boolean logic operations. That is, instead of executing the combinational logic computations given by the programmed instructions in the conventional digital processors, the invented digital signal processor intelligently processes digital information fully based on their configured content and perceptive non-volatile memory hardware.

Description of the Related Art

In the modern Von Neumann computing architecture as shown in FIG. 1, the Central Process Unit (CPU) executes logic operations according to the instructions and data from the main memory 11. The CPU 10 includes a main memory 11, an arithmetic and logic unit 12, an input/output equipment 13 and a program control unit 14. Prior to the computation process, CPU 10 is set by the program control unit 14 to point to the initial address code for the initial instruction in the main memory 11. The digital data are then processed with the arithmetic and logic unit 12 according to the sequential instructions in the main memory 11 accessed by the clock-synchronized address pointer in the program control unit 14. In general, the digital logic computation process for CPU 10 is synchronously executed and driven by a set of pre-written sequential instructions stored in the memory.

The power consumption for digital computations is given by $P \sim f \times C \times V_{DD}^2$, where f is the clock frequency, C is the total active circuit capacitance and $V_{DD}$ is the positive voltage supply for digital circuitries. Accordingly, the energy requirement for running a computation sequence is proportional to the numbers of clock steps to complete the set of instructions. Each instruction step includes fetching the instruction and data from the main memory 11, executing the micro-operations in the arithmetic and logic unit 12, and storing the resultant data back to the main memory 11 or outputting to the I/O (Input/Output) equipment 13. The total computation energy for completing a set of instructions is proportional to the frequency of memory accessing and the charging/discharging the total capacitances of the bus-lines and the active digital circuitries (registers, logic gates, and multiplexers). The more frequent memory accessing to complete the computation processing steps, the more energy and processing time are consumed for the digital processors.

While for a biologic nerve system the external stimuli such as lights, sounds, touches, tastes, and smells, are received by the fields of sensory organs connected to the nerve system. The neural signals in the forms of electrical pulses and neural transmitters (molecules) generated in the receptor fields are propagated to trigger the activation of next connecting layer of the neural network in the nerve system. The field of neural signals generated from the connecting layer continues to process forward throughout the multiple layers of the neural network hardware in the nerve system. Each neural network layer is parallel processing and extracting the information according to its neuromorphic structures and the receptive fields of neural signals from the previous layers. Unlike the present Von Neumann computing system iterating multiple logic computations for digital data by the pre-written instructions, the neural signals for information processing are propagated layer-to-layer in one-step feed-forward fashion by their neuromorphic structures. Therefore, in terms of information processing efficiencies and energy consumptions, the parallel processing and extracting information for layers of neural network in biologic nerve systems are superior to the processing and extracting information by multiple sequential logic computations in the present computing systems.

Inspired by the neural network information parallel processing, we are motivated to invent a digital signal processor analogous to the information processing in neural network systems directly by the processor's memory hardware for parallel processing digital signals within one feed-forward step. A digital symbol for digital information processing is generally represented by a string of bits (binary digits) in the combination of "0s" and "1s", where the signals of "1" and "0" are provided by the applying positive voltage $V_{DD}$ and the ground voltage $V_{SS}$ in digital circuitries respectively. An input digital symbol with multiple bits representing specific input content information can be intelligently processed to output another digital symbol representing the perceived information by the processor. The processor is given by the name of "Digital Perceptron". The meaning of "intelligently processed" is that the perceptive information is autonomously processed with the input digital "content" according to a pool of known knowledge of digital "contents". In contrast to the "content" processing, CPU processes information with logic operations and memory by pointing to the "address" locations and the logic contents of look-up-tables in FPGA (Field Programmable Gate Array) are extracted for digital processing by configuring their "address" multiplexers as well.

The digital perceptron can be configured to store a group of digital symbols and the correspondent output digital symbols in the non-volatile memory units similar to the built-in neural network hardware. The group of digital symbols can represent various scenarios in real world as the digital contents. The correspondent output digital symbols could be digital commands to drive an analog device or the input digital symbols for other digital perceptrons. For instance, a group of digital symbols could represent the digital IDs for a group of people and the correspondent output digital symbols are the two digital commands for "grant" or "deny" the access to a facility. When a person tries to access the facility, the signals of the digital symbol representing the person's digital ID are read and broadcasted into the non-volatile memory database configured with the digital symbols representing the digital IDs for the entire group of people. When the input digital symbol signals are matched with one of the configured digital symbols, the correspondent pre-configured digital command signals are immediately sent out to grant or to deny the person to access the facility. That is, the digital perceptron recognizes the person immediately by his/her digital ID and decides to let him/her access the facility or the opposite.

Upon applying the same scenario with the present computing architecture, the input digital symbol for the person's ID is fed to perform a binary search in the non-volatile memory database storage, where the group's digital symbols and their correspondent digital commands are stored and can be accessed only by the clock-driven memory addresses. The binary search operation for CPU then applies the bit comparison with the logic gate XOR, where the two input bits with "equal logic value" and "non-equal logic values" yield logic "0" and "1" respectively. Therefore, to perform the binary search for a digital symbol with plural bits requires multiple times of bit-data transmissions and comparisons between the "XOR" logic gate units and the memory in CPU, and data transmissions between CPU I/O equipment and non-volatile memory database storage. The energy and time consumed for searching a digital symbol by addresses in a large memory database storage become very inefficient as the general practice of running programmed software algorithm with many times of memory accessing between CPU and non-volatile memory database storage, and the data comparisons in the present computing system.

In another aspect of this invention, the multiple-time configurability of non-volatile memories in the digital perceptrons provides the capability of real-time updating the digital content and output symbols. The digital content and output symbols can be renewed anytime according to the coding efficiency and the learning algorithms for the real world scenarios. From the perspective, the digital perceptron can evolve into a processor for better processing efficiency and more desirable functions set by the learning algorithm as the training for the processor.

SUMMARY OF THE INVENTION

To fulfill the above described functions of digital perceptrons, we have applied the configurable non-volatile content memory array for storing the non-volatile digital content symbols (U.S. patent application Ser. No. 14/596,886, the disclosure of which is incorporated herein by reference in its entirety), and the Complementary Electrical Erasable Programmable Read Only Memory (CEEPROM) array disclosed in U.S. Pat. No. 8,817,546 B2 (the disclosure of which is incorporated herein by reference in its entirety) for storing the perceptive non-volatile digital symbols, to form the main portion of the digital perceptron. The digital perceptron 200 is shown in FIG. 2. In the digital perceptron 200, an n-bit×m-row non-volatile content memory array 600 through "2n" input lines 205 is connected to an n-bit input buffer and driver unit 700 with the connection of external n-bit input bus lines 250. When the "enabled high" signal at node 210 is activated by $V_{DD}$, the input buffer and driver unit 700 receives the digital symbol signals from the external n-bit input bus lines 250 and broadcasts the n-bit digital signals into the n-bit×m-row non-volatile content memory array 600. The "m" rows of the match-lines 203 in the non-volatile content memory array 600 attach to a match detector 800 connected to the correspondent m-row word-lines of the q-bit×m-row CEEPROM array 100 by the "m" switching lines 204. When the m-row match detector 800 is activated by the "enabled high" $V_{DD}$ signal at node 210, the "matching" signal from one of the m match detector cells 850 in the match detector 800 can switch on the correspondent wordline in the q-bit×m-row CEEPROM array 100. The q-bit output signals by the "q" output lines 206 are then sent to the q-bit output buffer and driver unit 110. Meanwhile the "matching" signal from one of the m match detector cells 850 is also fed into the match logic circuitry 900 to generate the "send high" $V_{DD}$ signal at the node 208 for connecting the q-bit output buffer and driver unit 110 with the external q-bit output bus lines 251 to send out the q-bit output signals. On the other hand, if the n-bit input data does not match any row of the configured non-volatile data in the non-volatile content memory array 600, the output buffer and driver unit 110 are not connected to the external output bus lines 251. The digital perceptron 200 then sends no digital signals out to the external output bus lines 251. This function is to imitate the information processing by biological nerve systems in response to the irrelevant information inputs from the environments.

The "inhibition" function can be commonly observed for the neural networks in biologic nerve systems. One classic example is the knee jerk case, where the combination of excitatory and inhibitory synaptic connections mediating the stretch reflex of the quadriceps muscles. To imitate this function, we apply a simple "AND" gate 209 having two input nodes, an "Enable" node 252 and an "Inhibition" node 253, for turning on and off the digital perceptron 200. The digital perceptron 200 is turned on by the "enable high" $V_{DD}$ signal at the node 210, if and only if for the "high" $V_{DD}$ signal at the "Enable" node 252 and the "low" $V_{SS}$ signal at the "Inhibition" node 253.

BRIEF DESCRIPTION OF THE DRAWINGS

For a better understanding of the present invention and to show how it may be carried into effect, reference will now be made to the following drawings, which show the preferred embodiment of the present invention, in which:

FIG. 11 shows the schematic of q-bit output buffer and driver unit in the digital perceptron according to an embodiment of the invention.

DETAILED DESCRIPTION OF THE INVENTION

Figure 1:
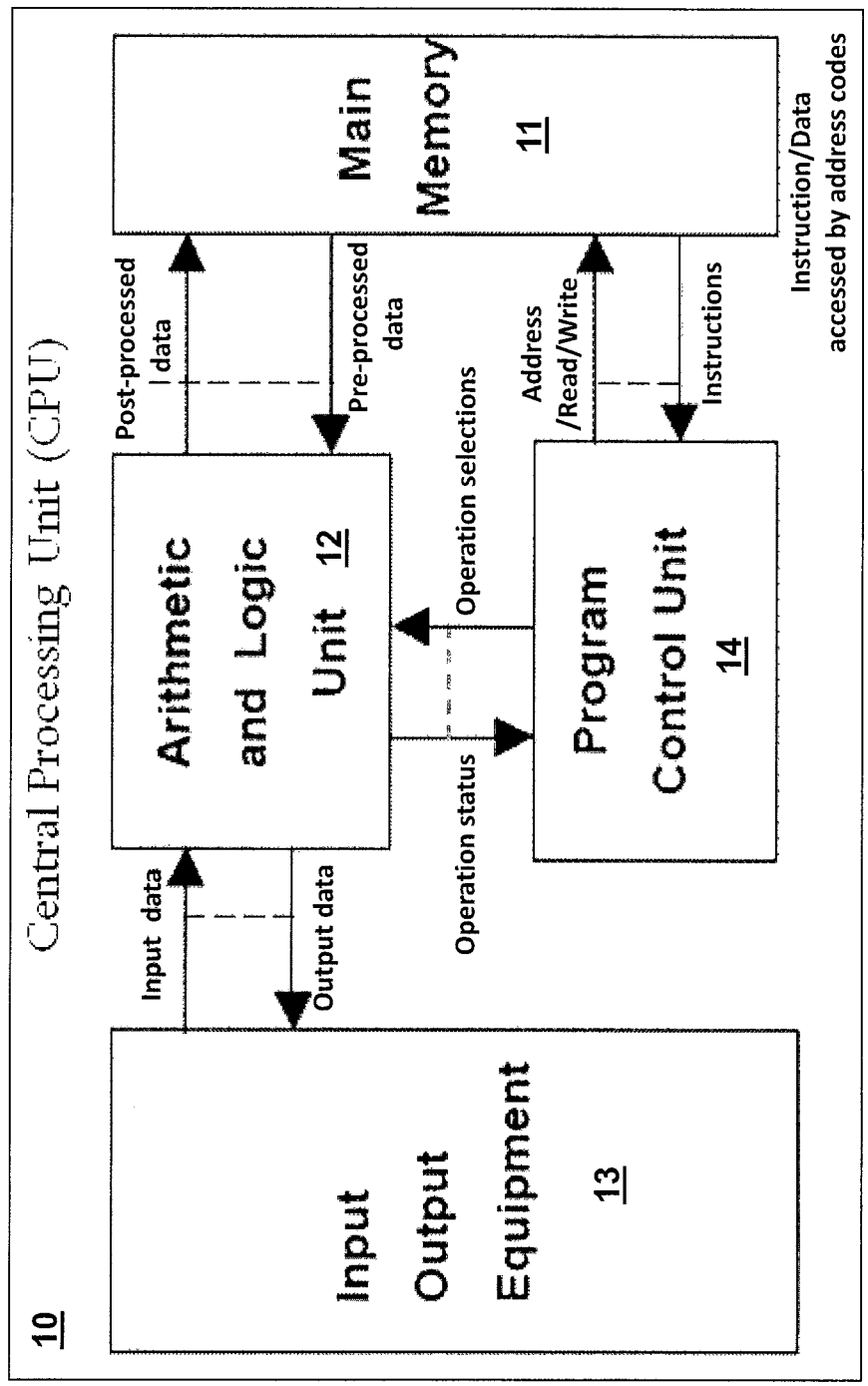
FIG. 1 shows the conventional Von-Neumann computing architecture for a typical Central Processing Unit (CPU).
Figure 2:
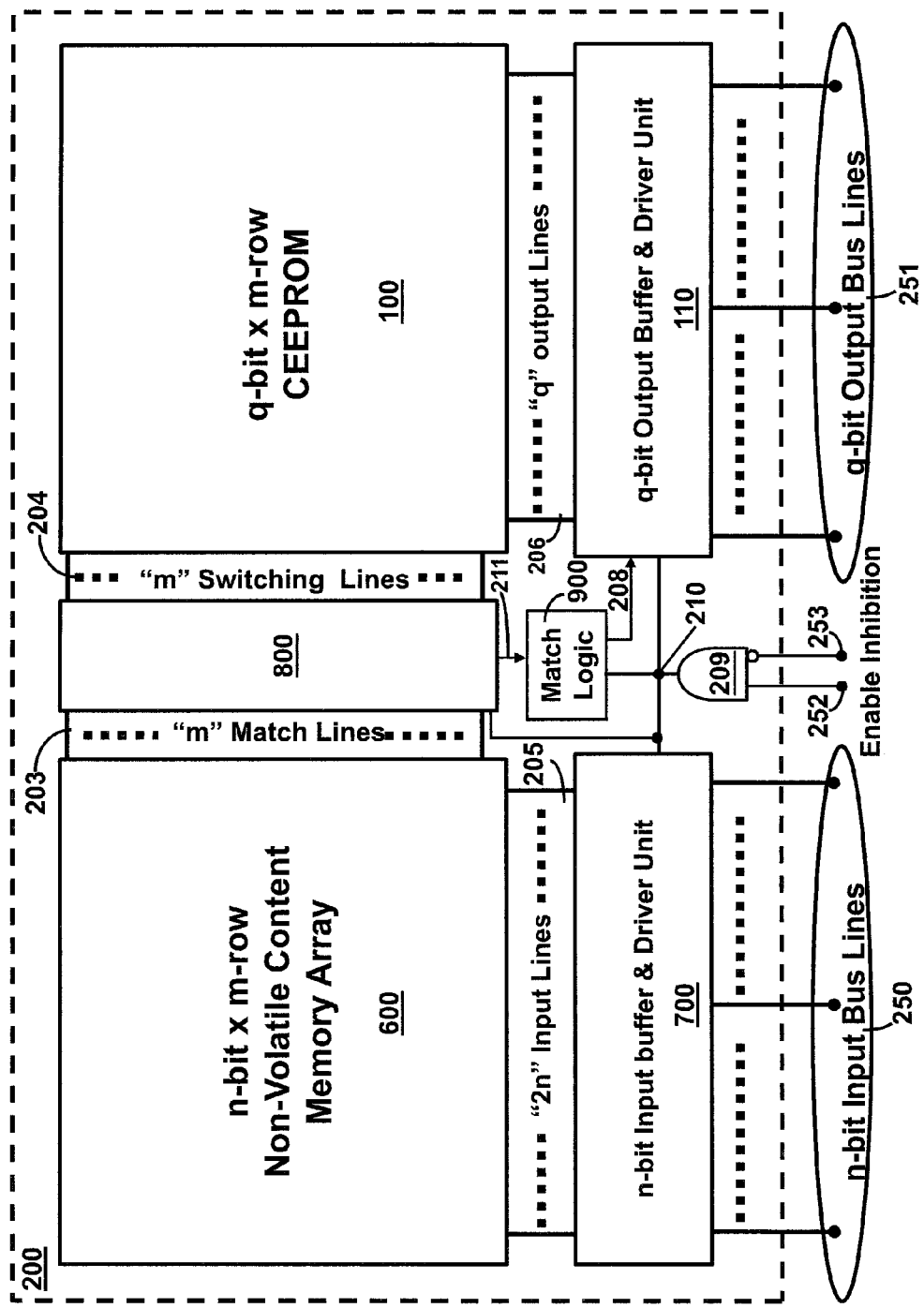
FIG. 2 shows the schematics of the digital perceptron according to the invention.

The following detailed description is meant to be illustrative only and not limiting. It is to be understood that other embodiment may be utilized and element changes may be made without departing from the scope of the present invention. Also, it is to be understood that the phraseology and terminology used herein are for the purpose of description and should not be regarded as limiting. Those of ordinary skill in the art will immediately realize that the embodiments of the present invention described herein in the context of methods and schematics are illustrative only and are not intended to be in any way limiting. Other embodiments of the present invention will readily suggest themselves to such skilled persons having the benefits of this disclosure. In the figures of the accompanying drawings, elements having the same reference numeral designations represent like elements throughout.

Figure 3:
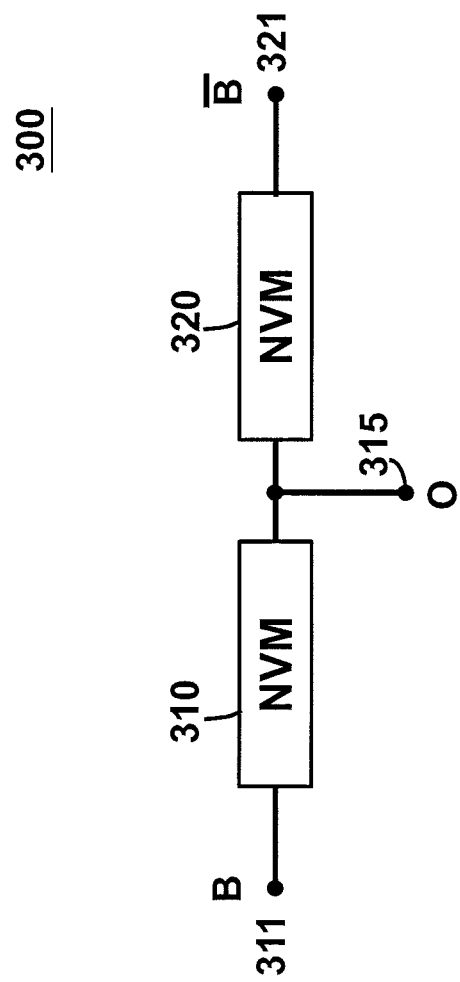
FIG. 3 shows the schematic of a pair of complementary non-volatile memory devices according to the invention.
Figure 4:
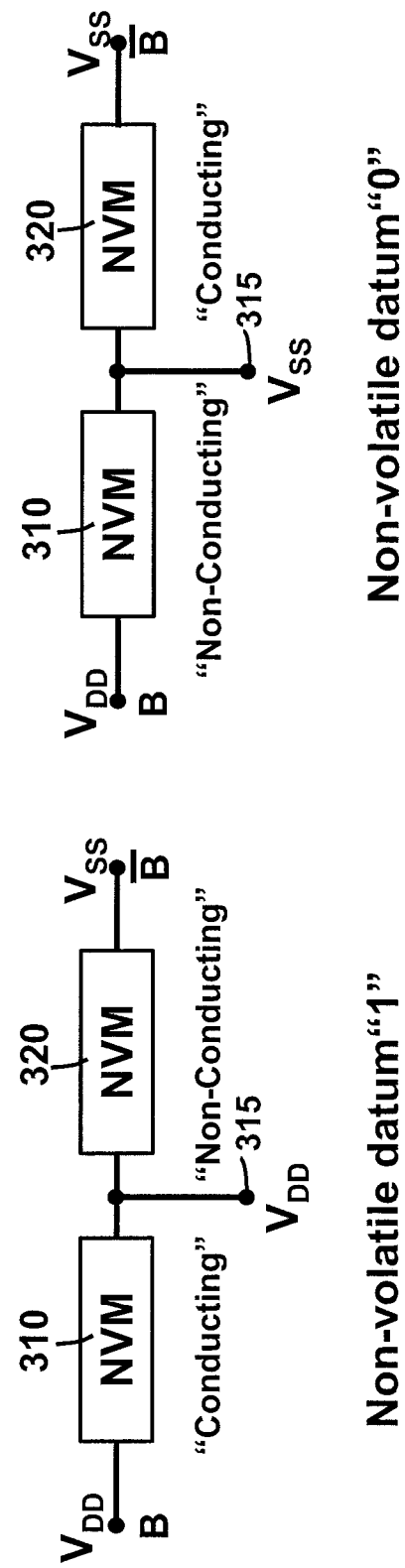
FIG. 4 illustrates the configuration definition of the non-volatile memory data for the pair of complementary non-volatile memory devices in FIG. 3.

In one embodiment, the complementary Non-Volatile Memory (NVM) devices 310 and 320 have applied to store a non-volatile binary digit (bit) as shown in FIG. 3. The terminals of the two NVM devices 310 and 320 are connected together to form the output node "O" 315 of the complementary non-volatile memory device pair 300. The other two terminals 311 and 321 of the complementary non-volatile memory pair form the input nodes, a "B" node 311 and a "$\overline{B}$" node 321, respectively. The complementary pair of the NVM devices 310 and 320 can be configured as one is in "conducting state" and the other is in "non-conducting state". As illustrated in FIG. 4, we can define the non-volatile datum "1" for the NVM device 310 configured in "conducting state" and the NVM device 320 configured in "non-conducting state", and the non-volatile datum "0" for the NVM device 310 configured in "non-conducting state" and the NVM device 320 configured in "conducting state". With the digital signals, $V_{DD}$ and $V_{SS}$, biased to the input nodes, the "B" node 311 and the "$\overline{B}$" node 321, the signals at the output node "O" 315 are $V_{DD}$ and $V_{SS}$ for the non-volatile data "1" and "0", respectively.

Figure 5:
FIG. 5 summarizes the applied voltage biases for the input digital data signals to match the configured non-volatile memory data defined in FIG. 4.

For matching the input digital data with the non-volatile data in the complementary non-volatile memory device pairs 300, we apply ($V_{DD}$ and $V_{SS}$) signals to "B" node 311 and "$\overline{B}$" node 321 for input datum "1", and ($V_{SS}$ and $V_{DD}$) signals to "B" node 311 and "$\overline{B}$" node 321 for input datum "0", respectively. Accordingly the signals at the output node "O" 315 for "matching" and "not-matching" the input data with the non-volatile data are always $V_{DD}$ and $V_{SS}$, respectively. The digital signals for matching the input data and non-volatile data are summarized in FIG. 5.

Figure 6:
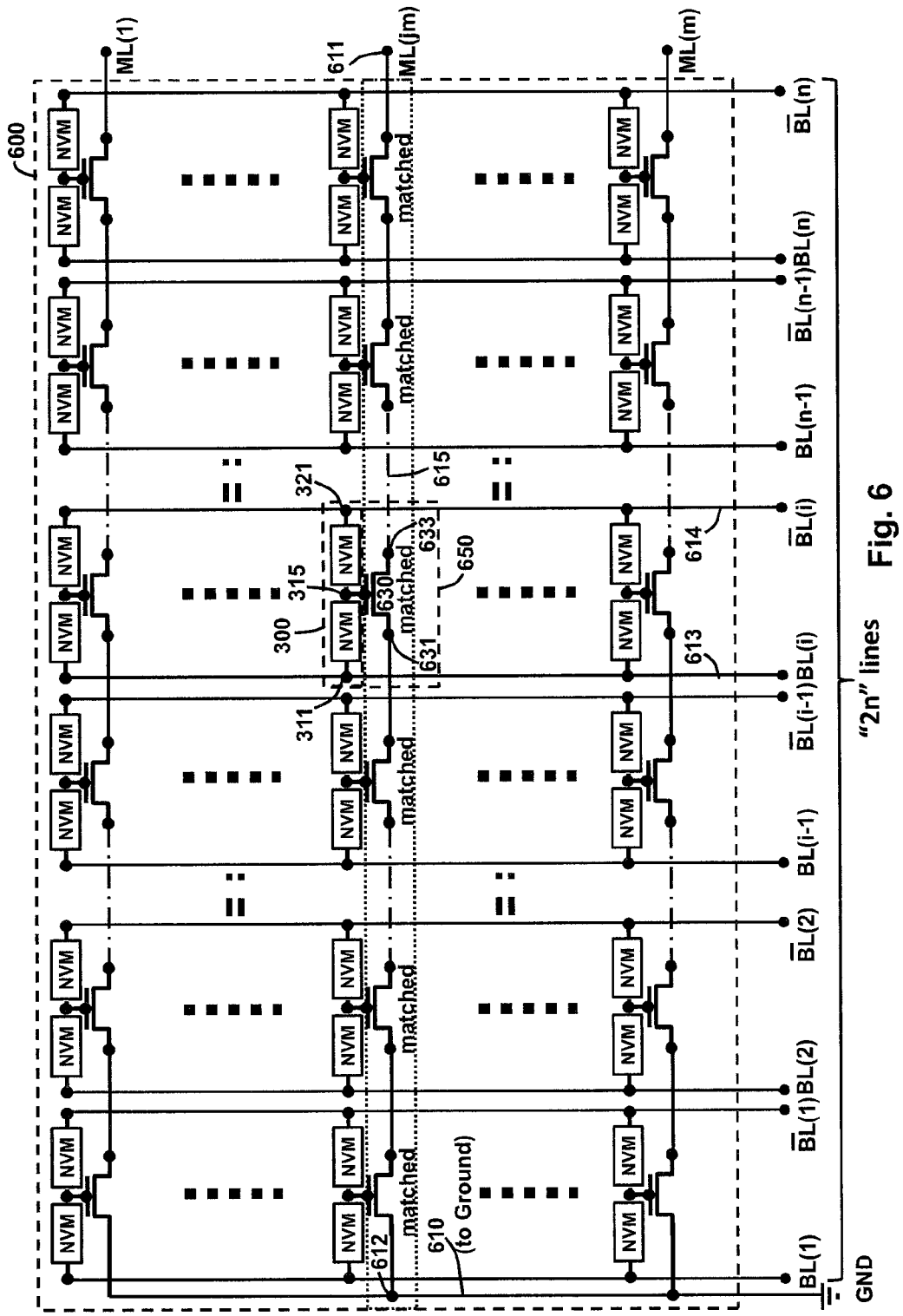
FIG. 6 shows the n-bit×m-rom NAND-type non-volatile content memory array in the digital perceptron according to one embodiment of the invention.
Figure 7:
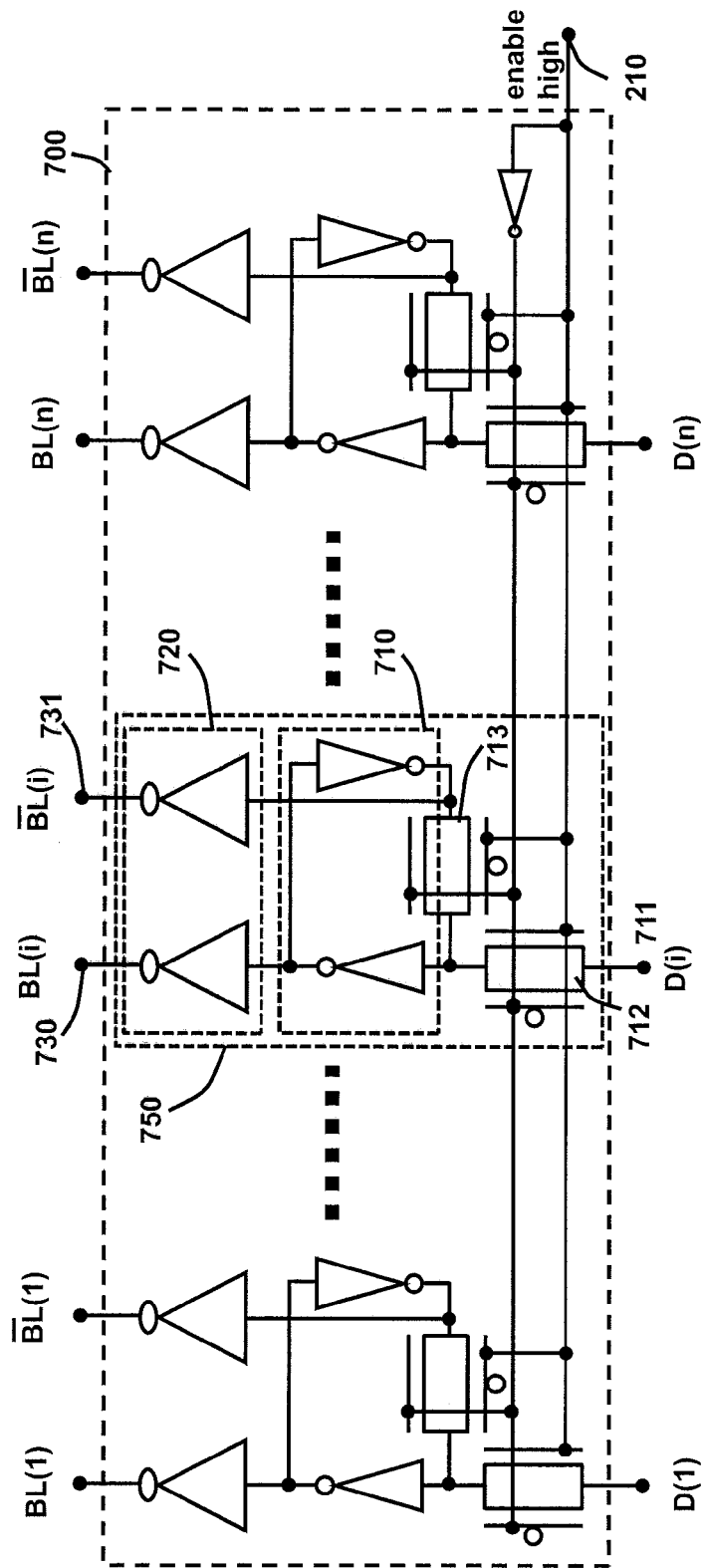
FIG. 7 shows the schematic of n-bit input buffer and driver unit in the digital perceptron according to an embodiment of the invention.
Figure 8:
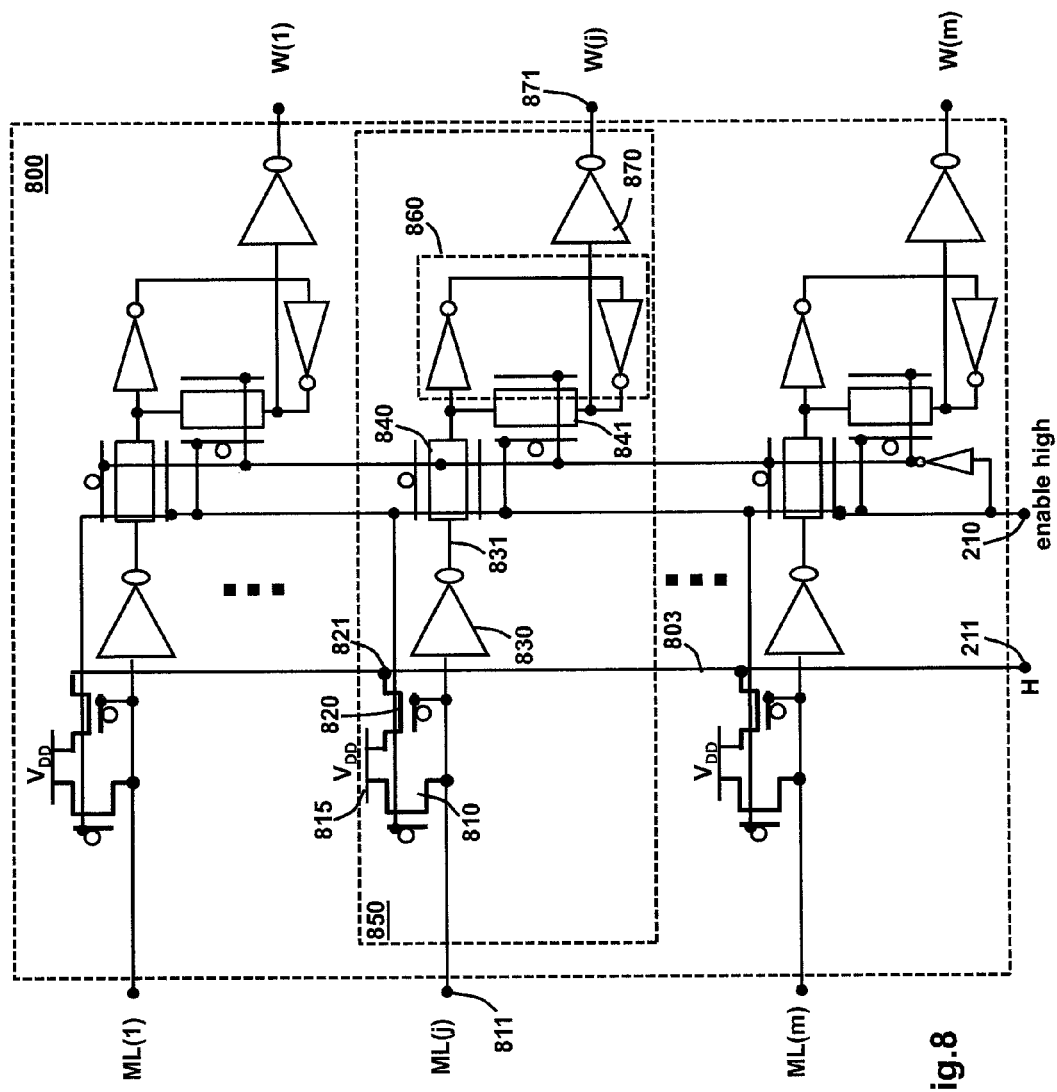
FIG. 8 shows the schematic of a match detector in the digital perceptron according to an embodiment of the invention.

We then apply the complementary non-volatile memory pair device 300 and a switching N-type MOSFET (Metal Oxide Semiconductor Field Effect Transistor) device 630 to form the non-volatile content memory cell 650 shown in FIG. 6. The output node 315 of the complementary non-volatile memory pair device 300 is connected with the gate of N-type MOSFET device 630 in each non-volatile content memory cell 650. For the "n"-bit×"m"-row NAND-type content memory array 600 shown in FIG. 6, the input nodes 311 and 321 of the complementary non-volatile memory pair devices 300 in each column are connected to form BL(i) line 613 and $\overline{BL}$(i) line 614 for i=1, 2 . . . , n columns. The N-type MOSFET devices 630 in each row are connected in series to form the matching lines ML(j) 615, for j=1, 2 . . . , m rows, of the NAND-type content memory array 600. End nodes 612 of the matching lines 615 are connected altogether to form the common source line (CSL) 610 tied to the ground voltage. When the input digital signals, ($V_{DD}$ and $V_{SS}$) for datum "1", and ($V_{SS}$ and $V_{DD}$) for datum "0", are applied to BL(i) line and $\overline{BL}$(i) line respectively for searching non-volatile digital data in the n-bit columns, the "matching" signal $V_{DD}$ at node 315 turns on the N-type MOSFET devices 630 to electrically connect their source electrodes 631 and drain electrodes 633 in the non-volatile content memory cells 650. While the "not-matching" signal $V_{SS}$ turns off the N-type MOSFET devices 630 to electrically disconnect their source electrodes 631 from drain electrodes 633 in the non-volatile content memory cells 650. Therefore if and only if the n-bit input digital signals match the entire row of n-bit non-volatile data for turning on all the N-type MOSFET devices 630 in the row, the output node 611 of the matching line ML(jm) 615 is electrically connected to the ground CSL line 610.

In the embodiment, the n-bit input buffer and driver unit 700 is formed by a row of "n" input buffer and driver cells 750. Each input buffer and driver cell i 750, for each i=1, 2 . . . , n, consists of two transmission gates 712 and 713, cross-inverter buffer 710, and a pair of bit-datum drivers 720. When the "$V_{DD}$" signal is at the "enable high" node 210, the transmission gate 712 is "on" to pass the digital signals from the input node D (i) 711 to the cross-inverter buffer 710. Meanwhile the bit-datum signal and its complementary signal from the cross-inverter buffer 710 are amplified by the bit-datum driver 720 at the nodes 730 and 731 to drive up the bitlines BL(i) and $\overline{BL}$(i) in the non-volatile content memory array 600. When the "$V_{SS}$" signal is at the "enable high" node 210, the transmission gates 712 are "off" to disconnect from the input node D(i) 711 and the transmission gate 713 are "on" to retain the data in the cross-inverter buffers 710. The row of "n" input buffer and driver cells 750 are synchronously controlled by the "enable high" signals at node 210 for receiving the n-bit data signals from the n-bit input bus lines 250 and retaining the n-bit data in the data buffers 710.

In the embodiment, the match detector 800 is formed by a column of "m" match detector cells 850. Each match detector cell 850 consists of the match-line pre-charging PMOSFET 810, the "hit" PMOSFET 820, the conversion buffer 830, the transmission gates 840 and 841, the match-value buffer 860, and the wordline driver 870. When the "enable high" signal $V_{DD}$ is at the node 210, for each j=1, 2 . . . , m, the match-line pre-charging PMOSFET devices 810 are "off" to disconnect the match-line nodes ML(j) 811 from $V_{DD}$, and the transmission gates 840 are "on" to receive the voltage signals from the output lines 831 of the conversion buffers 830. If and only if the n-bit input digital data match the row of n-bit non-volatile data to connect the row match-line to the ground potential in the non-volatile content memory array 600, the voltage potential for the matched node ML(jm) 811 is rapidly discharged from the initial voltage $V_{DD}$ to the ground voltage $V_{SS}$. The data match signal $V_{DD}$ at 831 for the matched row is then captured in the match-value buffer 860. The match signal $V_{DD}$ in the match-value buffer 860 is amplified by the wordline driver 870 at the connecting node 871 to switch on the correspondent wordline W(jm) in the non-volatile CEEPROM array 100. Otherwise, the voltage potentials at the ML(j) nodes 811, j≠jm, for the "not-match" rows remain near $V_{DD}$ for the period of "enable high" time. The data unmatched signal $V_{SS}$ in the match-value buffers 860 for the "not-match" rows remains off for the correspondent wordlines in the non-volatile CEEPROM array 100. Meanwhile for the matched row, the voltage signal $V_{SS}$ at node 811 by discharging one of the match-lines can turn on the "hit" PMOSFET 820 in the match detector cell 850 to charge the "H" node 211 to $V_{DD}$. Otherwise, if none of the rows in the n-bit×m-row non-volatile content memory array 600 can match to discharge their match-lines, the output signal at the "H" 211 cannot be charged to $V_{DD}$ due to all the "hit" PMOSFET devices 820 in the match detector cells 850 being off. The $V_{DD}$ signal at the "H" node 211 is applied to activate the "Match Logic" circuitry 900 to connect the q-bit output buffer and driver unit 110 with the output bus-lines 251 for sending the output digital signals.

Figure 9:
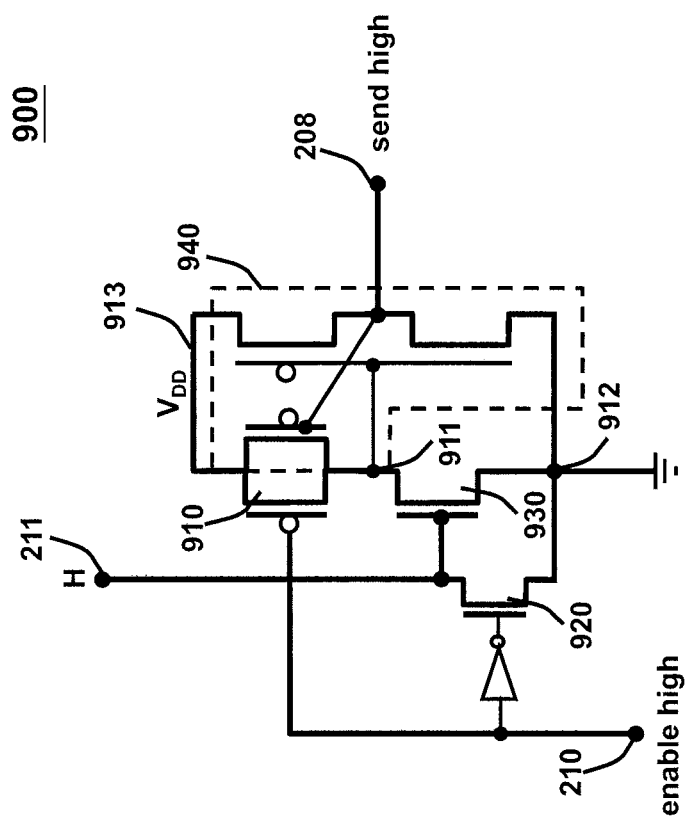
FIG. 9 shows the schematic of the Match Logic circuitry in the digital perceptron according to an embodiment of the invention.

In the embodiment, the "Match Logic" circuitry 900 is shown in FIG. 9. When the "enable high" node 210 is applied with $V_{SS}$, the PMOSFET 910 and the NMOSFET 920 are both "on" to have the voltage potential $V_{DD}$ at node 911 such that the voltage potential at the node "send high" 208 of the half latch 940 is $V_{SS}$. When the "enable high" node 210 is activated with $V_{DD}$ to turn off both PMOSFET 910 and NMOSFET 920, the NMOSFET 930 is "on" only with $V_{DD}$ at the "H" node 211 to pull down the voltage potential at node 911 to the ground voltage such that the voltage potential at the node "send high" 208 of the half latch 940 is $V_{DD}$. Therefore the $V_{DD}$ signal at the node "send high" 208 of the half latch 940 is applied to connect the q-bit output buffer and driver unit 110 to the q-bit output bus-lines 251 only for the $V_{DD}$ signal at the "H" node 211. Accordingly, if the n-bit input data match one row of n-bit non-volatile content data in content memory array 600, the $V_{DD}$ signal at the "H" node 211 from one of the match detector cells 850 activates the "Match Logic" circuitry 900 to connect the q-bit output buffer and driver unit 110 with the q-bit output bus-lines 251. Otherwise, the q-bit output buffer and driver unit 110 are not connected with the output q-bit bus-lines 251 for the "no-match" content memory situation.

Figure 10:
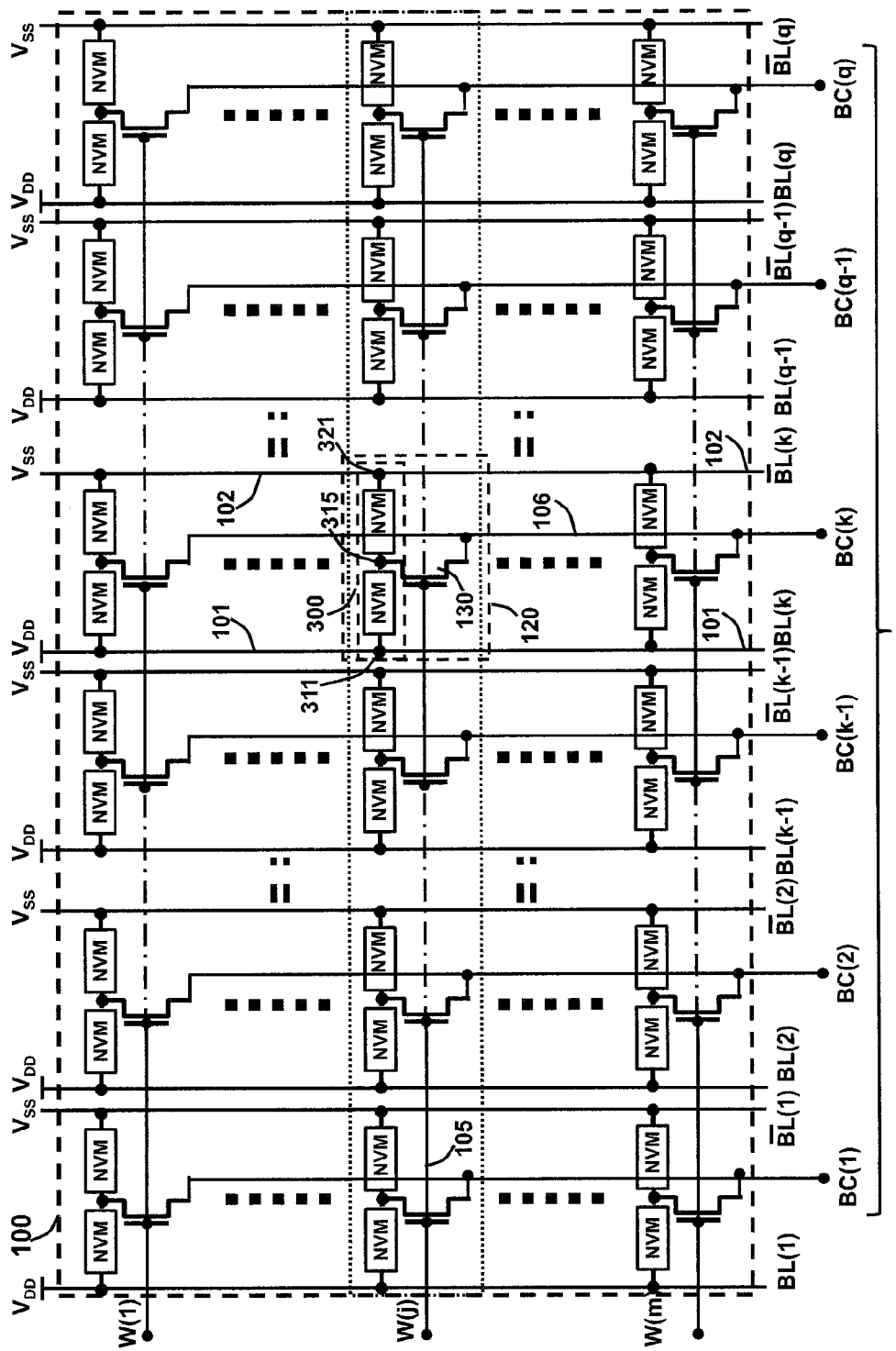
FIG. 10 shows a q-bit×m-row CEEPROM memory array in the digital perceptron according to an embodiment of the invention.

In the embodiment the "q"-bit×"m"-row CEEPROM array 100 is shown in FIG. 10. We then apply the complementary non-volatile memory pair device 300 and an access NMOSFET device 130 to form a CEEPROM cell 120. The input nodes 311 and 321 of the complementary non-volatile memory pair devices 300 in each column are connected to form BL(k) line 101 and $\overline{BL}$(k) line 102 for k=1, 2 ..., q columns. The output node 315 of the complementary non-volatile memory pair device 300 is connected to the source electrode of the access NMOSFET 130 with the drain electrode attached to the output bitline BC(k) 106. The gates of the access NMOSFET devices 130 in the row j for j=1, 2 ..., m, are connected to form the wordline W(j) 105 of the CEEPROM array 100. When the bitlines BL(k) and $\overline{BL}$(k) for k=1, 2 ..., q are biased with the $V_{DD}$ and $V_{SS}$ respectively, the signals at the output nodes 315 of the complementary non-volatile memory device pairs 300 are $V_{DD}$ for the non-volatile datum "1" and $V_{SS}$ for the non-volatile datum "0". If the match detector 800 sends a match signal $V_{DD}$ to turn on the correspondent wordline W(j) in response to the matched row in the non-volatile content memory array 600, the signals of the q-bit data stored in the row of the CEEPROM cells 120 are passed to the output bitlines BC(k) 106 for k=1, 2 ..., q. Otherwise, the correspondent wordlines with the unmatched signal $V_{SS}$ from the match detectors 800 in response to the unmatched rows in the non-volatile content memory array 600 remain off to output no data to the output bitlines BC(k) 106 for k=1, 2 ..., q.

In the embodiment, the q-bit output buffer and driver unit 110 are formed by a row of "q" output buffer and driver cells 150. The input node 155 of the output buffer and driver cell 150 is connected to the output bitline BC(k), for each k=1, 2 ..., q, of the q-bit×m-row CEEPROM array 100. The output buffer and driver cell 150 consists of two transmission gates 151 and 152, cross-inverter buffer 153, and tri-state output driver 154. When the "enable high" node 210 is activated with $V_{DD}$, the row of the transmission gates 151 are turned on for sending the signals from the output bitline BC(k), for k=1, 2 ..., q, to the cross-inverter buffers 153. If the row of tri-state drivers 154 is activated by the "send high" signal $V_{DD}$ at the node 208, the q-bit data are then amplified by the tri-state driver 154 to drive the q-bit output bus lines 251 for sending the perceptive digital data out of the digital perceptron 200.

The aforementioned description of the preferred embodiments of the invention has been presented for purposes of illustration and description. It is not intended to be exhaustive or to limit the invention to the precise form or to exemplary embodiments disclosed. Accordingly, the description should be regarded as illustrative rather than restrictive. Obviously, many modifications and variations of non-volatile memory elements including the types of non-volatile memory devices such as the conventional MOSFET devices with floating gate, charge trap dielectrics, or nano-crystals for charge storage material, and the non-volatile memory devices having the "conducting" and "non-conducting" states to form a complementary memory device pair such as Read Only Memory (ROM), Phase Change Memory (PCM), Programmable Metallization Cell (PMC), Magneto-Resistive Random Memories (MRAM), Resistive Random Access Memory (RRAM), Carbon Nano-Tube Memory (CNTM), and Nano-Random Access Memory (NRAM) will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A digital perceptron device, comprising:
    a non-volatile content memory array having m rows by n columns of first memory cells for parallel comparing a n-bit input symbol with a number m of n-bit non-volatile content symbols pre-configured in the m rows of first memory cells respectively having m first output nodes, wherein each of the m first output nodes generates an indication signal indicative of whether the n-bit input symbol matches its pre-configured n-bit non-volatile content symbol;
    a match detector circuit having m detector cells that are respectively connected to the m first output nodes and that have m second output nodes, wherein each of the m detector cells generates a digital switching signal at its second output node after receiving a corresponding indication signal;
    a non-volatile perceptive memory array having m rows by q columns of second memory cells, wherein the m rows of second memory cells are respectively connected to the m second output nodes and pre-configured with a number m of q-bit non-volatile perceptive symbols, wherein a received digital switching signal with a first voltage level switches on a corresponding row of second memory cells to output a corresponding q-bit non-volatile perceptive symbol as a q-bit output symbol, wherein a received digital switching signal with a second voltage level switches off a corresponding row of second memory cells, and wherein m, n and q are greater than one;

wherein each of the m rows by n columns of first memory cells and the m rows by q columns of second memory cells comprises a non-volatile memory (NVM) device pair, and each NVM device pair outputs one of a high operating voltage VDD and a ground voltage VSS of the digital perceptron device in response to two input voltages VDD and VSS, wherein the digital perceptron device further comprises an output bus; and an output buffer and driver unit located between bit lines of the non-volatile perceptive memory array and the output bus for temporarily storing the q-bit output symbol and amplifying the q-bit output symbol signal to drive the output bus, wherein whether the output buffer and driver unit is electrically connected to the bit lines of the non-volatile perceptive memory array depends on a first control signal, and whether the output buffer and driver unit is electrically connected to the output bus depends on a second control signal; and wherein the second control signal is activated when the n-bit input symbol matches one of the number m of pre-configured n-bit non-volatile content symbols.

2. The digital perceptron device according to claim 1, wherein the n-bit input symbol matches zero or one of the number m of pre-configured n-bit non-volatile content symbols so that zero or one of the number m of pre-configured q-bit non-volatile perceptive symbols is outputted as the q-bit output symbol.

3. The digital perceptron device according to claim 1, wherein each of the m detector cells generates the digital switching signal in response to the first control signal, and wherein the first control signal is activated when the digital perceptron device is turned on.

4. The digital perceptron device according to claim 3, further comprising:

an input bus for receiving a n-bit input signal; and an input buffer and driver unit connected between bit lines of the non-volatile content memory array and the input bus for temporarily storing and amplifying the n-bit input signal to output the n-bit input symbol according to the first control signal.

5. The digital perceptron device according to claim 1, wherein the m rows by n columns of first memory cells are organized in a plurality of NAND strings and the non-volatile content memory array comprises:

a number m of match lines respectively connected to the m first output node, each match line being formed by series-connected switching transistors of the first memory cells in a corresponding NAND string;

a number n of first complementary bit line pairs for receiving the n-bit input symbol, each first complementary bit line pair being connected to the first memory cells in a column; and a common source line for connecting the same-side terminals of the match lines altogether to a predetermined voltage terminal.

6. The digital perceptron device according to claim 5, wherein each first memory cell consists of:

a first non-volatile memory (NVM) device and a second NVM device, the first NVM device and the second NVM device respectively in a conducting state and a non-conducting state indicating a first non-volatile binary datum, the first NVM device and the second NVM device respectively in the non-conducting state and the conducting state indicating a second non-volatile binary datum; and the switching transistor, wherein two first terminals of the first NVM device and the second NVM device are connected together to a gate electrode of the switching transistor, a second terminal of the first NVM device being connected to a first bit line of one first complementary bit line pair, a second terminal of the second NVM device being connected to a second bit line of the first complementary bit line pair.

7. The digital perceptron device according to claim 1, wherein the non-volatile perceptive memory array comprises:

a number m of word lines respectively connected to the m second output node, each word line being formed by gates of access transistors of the second memory cells in a row;

a number q of second complementary bit line pairs, each second complementary bit line pair being connected to the second memory cells in a column; and a number q of output bit lines, each of which extends vertically and is connected to the outputs of the second memory cells in a column.

8. The digital perceptron device according to claim 7, wherein each second memory cells consists of:

a third NVM device and a fourth NVM device, the third NVM device and the fourth NVM device respectively in a conducting state and a non-conducting state indicating a third non-volatile binary datum, and the third NVM device and the fourth NVM device respectively in the non-conducting state and the conducting state indicating a fourth non-volatile binary datum; and the access transistor, wherein two first terminals of the third NVM device and the fourth NVM device are connected together to a source electrode of the access transistor, a second terminal of the third NVM device being connected to a first bit line of one second complementary bit line pair, a second terminal of the second NVM device being connected to a second bit line of the second complementary bit line pair;

wherein drain electrodes of the access transistors in one column are connected together to form one of the output bit lines.

9. The digital perceptron device according to claim 1, wherein the number m of pre-configured n-bit non-volatile content symbols in the non-volatile content memory array and the number m of pre-configured q-bit non-volatile perceptive symbols in the non-volatile perceptive memory array are capable of being re-configured in real time according to at least one of coding efficiency and a learning algorithm.

10. The digital perceptron device according to claim 1, wherein the q-bit output symbol is autonomously processed with the n-bit input symbol according to the number m of pre-configured n-bit non-volatile content symbols and the number m of pre-configured q-bit non-volatile perceptive symbols.

11. A method for operating a digital perceptron device comprising a non-volatile content memory array and a non-volatile perceptive memory array, the method comprising:

parallel comparing an n-bit input symbol with a number m of n-bit non-volatile content symbols pre-configured in the non-volatile content memory array having m rows by n columns of first memory cells so that each of the m rows of first memory cells generates an indication signal indicative of whether the n-bit input symbol matches its pre-configured n-bit non-volatile content symbol;

respectively obtaining m digital switching signals according to m indication signals;

respectively receiving the m digital switching signals by m rows of second memory cells in the non-volatile perceptive memory array having m rows by q columns of second memory cells, wherein the m rows of second memory cells are respectively pre-configured with a number m of q-bit non-volatile perceptive symbols;

switching on a corresponding row of second memory cells to output a corresponding q-bit non-volatile perceptive symbol as a q-bit output symbol in response to one digital switching signal having a first voltage level; and switching off a corresponding row of second memory cells in response to one digital switching signal having a second voltage level, wherein m, n and q are greater than one;

wherein each of the m rows by n columns of first memory cells and the m rows by q columns of second memory cells comprises a non-volatile memory (NVM) device pair, and each NVM device pair outputs one of a high operating voltage VDD and a ground voltage VSS of the digital perceptron device in response to two input voltages VDD and VSS, wherein the method further comprises:

temporarily storing the q-bit output symbol according to a first control signal;

amplifying the q-bit output symbol to obtain a q-bit output signal; and outputting the q-bit output signal in response to a second control signal, wherein the second control signal is activated when the n-bit input symbol matches one of the number m of pre-configured n-bit non-volatile content symbols.

12. The method according to claim 11, wherein the n-bit input symbol matches zero or one of the number m of pre-configured n-bit non-volatile content symbols so that zero or one of the number m of pre-configured q-bit non-volatile perceptive symbols is outputted as the q-bit output symbol.

13. The method according to claim 11, wherein the step of respectively obtaining the m digital switching signals further comprises:

respectively obtaining the m digital switching signals based on the m indication signals in response to the first control signal, wherein the first control signal is activated when the digital perceptron device is turned on.

14. The method according to claim 13, further comprising:

prior to the step of parallel comparing, temporarily storing an n-bit input signal; and amplifying the n-bit input signal to obtain the n-bit input symbol according to the first control signal.

15. The method according to claim 11, wherein the q-bit output symbol is autonomously processed with the n-bit input symbol according to the number m of pre-configured n-bit non-volatile content symbols and the number m of pre-configured q-bit non-volatile perceptive symbols.

16. The method according to claim 11, further comprising:

prior to the step of parallel comparing, configuring the non-volatile content memory array with the number m of n-bit non-volatile content symbols and the non-volatile perceptive memory array with the number m of q-bit non-volatile perceptive symbols according to at least one of coding efficiency and a learning algorithm.

17. The method according to claim 11, further comprising:

after the steps of switching on and switching off, re-configuring the non-volatile content memory array with a number m of updated n-bit non-volatile content symbols and the non-volatile perceptive memory array with a number m of updated q-bit non-volatile perceptive symbols according to at least one of coding efficiency and a learning algorithm.

* * * * *